US008873820B2

(12) United States Patent
Grodzki (10) Patent No.: US 8,873,820 B2
(45) Date of Patent: Oct. 28, 2014

(54) MAGNETIC RESONANCE SYSTEM AND METHOD TO AUTOMATICALLY GENERATE A SELECTIVE MR IMAGE

(75) Inventor: David Grodzki, Hannover (DE)

(73) Assignee: Siemens Aktiengesellschaft, Munich (DE)

(*) Notice: Subject to any disclaimer, the term of this patent is extended or adjusted under 35 U.S.C. 154(b) by 169 days.

(21) Appl. No.: 13/245,216

(22) Filed: Sep. 26, 2011

(65) Prior Publication Data

US 2012/0076383 A1 Mar. 29, 2012

(30) Foreign Application Priority Data

Sep. 27, 2010 (DE) .......................... 10 2010 041 448

(51) Int. Cl.
*G06K 9/00* (2006.01)
*G01R 33/48* (2006.01)

(52) U.S. Cl.
CPC ........ *G01R 33/4816* (2013.01); *G01R 33/4824* (2013.01); *G01R 33/4828* (2013.01)
USPC .......................................... 382/131; 382/128

(58) Field of Classification Search
USPC .................................................. 382/128, 131
See application file for complete search history.

(56) References Cited

U.S. PATENT DOCUMENTS

| 2004/0140803 A1* | 7/2004 | Deimling | 324/309 |
|---|---|---|---|
| 2005/0110489 A1 | 5/2005 | Miyoshi | |
| 2007/0255129 A1* | 11/2007 | Du et al. | 600/410 |
| 2008/0007264 A1* | 1/2008 | Ichinose | 324/318 |
| 2010/0256968 A1* | 10/2010 | Dietz et al. | 703/13 |
| 2011/0018537 A1* | 1/2011 | Warntjes | 324/309 |
| 2011/0280456 A1* | 11/2011 | Sussman et al. | 382/131 |

OTHER PUBLICATIONS

"3D Radial Projection Technique With Ultrashort Echo Times for Sodium MRI: Clinical Applications in Human Brain and Skeletal Muscle," Nielles-Vallespin et al., Magnetic Response in Medicine, vol. 57 (2007) pp. 74-83.
"Rapid Single Point (RASP) Imaging," Heid et al., SMR, $3^{rd}$ Annual Meeting (1995) p. 684).
"Quantitative $T_2$ Analysis: The Effects of Noise, Regularization, and Multivoxel Approaches," Bjarnson et al., Magnetic Resonance in Medicine, vol. 63, (2010) pp. 212-217.
Magnetic Resonance Imaging of Short $T_2$ Components in Tissue, Gatehouse et al., Clinical radiology, vol. 58 (2003) pp. 1-19.
"Ultrashort $T_2$ Relaxometry for Quantitation of Highly Concentrated Superparamagnetic Iron Oxide (SPIO) Nanoparticle Labeled Cells," Liv et al., Magnetic Resonance in Medicine, vol. 61 (2009) pp. 761-766.

* cited by examiner

*Primary Examiner* — Matthew Bella
*Assistant Examiner* — Weiwen Yang
(74) *Attorney, Agent, or Firm* — Schiff Hardin LLP (57) ABSTRACT

In a magnetic resonance method and system for automatic generation of a selective MR image from a first MR image (corresponding to raw data acquired at a first echo time after excitation pulses) and a second MR image (corresponding to raw data acquired at a second echo time after the same excitation pulses), for each image point of the MR images, a time constant is calculated for tissue to be imaged at the respective image point depending on the intensity values of the corresponding image points of the first and second MR images. The calculated time constant is compared with at least one threshold in order to associate a weighting factor with that image point. The selective MR image is generated by processing the intensity values of the image points of the first and/or second MR image with the associated weighting factors.

15 Claims, 4 Drawing Sheets

MAGNETIC RESONANCE SYSTEM AND METHOD TO AUTOMATICALLY GENERATE A SELECTIVE MR IMAGE

RELATED APPLICATION

This Application is related to an application filed simultaneously herewith having Ser. No. 13/245,191 and entitled "Magnetic Resonance System and Method to Generate an Image Data Set" (Grodzki et al.), and another application filed simultaneously herewith having Ser. No. 13/246,019 and entitled "Magnetic Resonance System and Method to Generate an Image Data Set" (Grodzki).

BACKGROUND OF THE INVENTION

1. Field of the Invention

The invention concerns a method to automatically generate a selective MR image as well as a correspondingly designed magnetic resonance system, a corresponding computer program product and a corresponding electronically readable data medium.

2. Description of the Prior Art

Imaging by means of nuclear magnetic resonance, i.e. magnetic resonance tomography or MR tomography, has found an ever broader field of application in medical diagnostics.

Magnetic resonance technology (in the following the abbreviation MR stands for magnetic resonance) is a known technique with which images of the inside of an examination subject can be generated. In simplified form, the examination subject is positioned in a comparably strong, static, homogeneous basic magnetic field (field strengths of 0.2 Tesla to 7 Tesla or more) in an MR apparatus so that nuclear spins in the subject orient along the basic magnetic field. For spatial coding of the measurement data, rapidly switched gradient fields are superimposed on the basic magnetic field.

To trigger nuclear magnetic resonance signals, radio-frequency excitation pulses are radiated into the examination subject, the triggered nuclear magnetic resonance signals are measured and are stored as raw data in k-space, on the basis of which raw data MR images are reconstructed. MR imaging enables image contrasts that result from the combination of multiple parameters. Important MR parameters are, for example, the density of the excited nuclear spins (primarily hydrogen protons), the relaxation times for magnetizations (T1, T2, T2*) of the examined tissue, the magnetization transfer, and diverse other contrast mechanisms.

Magnetic resonance tomography lends itself to new fields of use through the acquisition of MR data with very short echo times TE (for example TE<500 μs), wherein the echo time corresponds to the time period between the excitation of the nuclear spins and the measurement of the nuclear magnetic resonance that is thus triggered. It is thereby possible to show substances or tissue that cannot be depicted by means of conventional sequences for example a (T)SE ("(Turbo) Spin Echo") sequence or a GRE ("Gradient Echo") sequence, since their T2 time (the relaxation of the transverse magnetization of the substance or tissue) is markedly shorter than the echo time, and thus a corresponding signal from these substances or tissues has already decayed at the point in time of acquisition. With echo times that lie in the range of the corresponding decay time, it is possible, for example, to show bones, teeth or ice in an MR image even though the T2 time of these objects lies in a range from 30-80 μs.

According to the prior art, sequences are known that enable a very short echo time. One example is the radial UTE ("Ultrashort Echo Time") sequence as described in, for example, the article by Sonia Nielles-Vallespin "3D radial projection technique with ultrashort echo times for sodium MRI: Clinical applications in human brain and skeletal muscle", Magn. Res. Med. 2007; 57; P. 74-81. In this sequence type the gradients are ramped up after a wait time T_delay after a non-selective or slice-selective excitation, and the data acquisition is begun at the same time. The k-space trajectory scanned in such a manner after an excitation proceeds radially outwardly from the k-space center. Therefore, before the reconstruction (by means of Fourier reconstruction) of the image data from the raw data acquired in k-space, the raw data must first be converted into a Cartesian k-space grid (for example by regridding).

An additional approach in order to enable short echo times is to scan k-space in points with the free induction decay (FID) signal being detected. Such a method is also designated as a single point imaging because essentially only one raw data point in k-space is acquired per RF excitation. One example of such a method for single point imaging is the RASP method ("Rapid Single Point (RASP) Imaging", O. Heid, M. Deimling, SMR, 3rd Annual Meeting, Page 684, 1995). According to the RASP method, one raw data point in k-space, the phase of which was coded by gradients, is read out at a fixed point in time after the RF excitation at the "echo time" TE. The gradients are modified by means of the magnetic resonance system for each raw data point or measurement point, and thus k-space is scanned (filled) point by point as is shown in FIGS. 1a and 1b.

There are many applications of magnetic resonance tomography in which it is desired to differentiate different tissue types.

For example, in the case of tissue types with different chemical shifts, a different magnetic field results at the nucleus, which leads to different resonance frequencies. In the signal acquisition this leads to different phase angles of the two components. The most prominent representatives of two different tissue types in the magnetic resonance signal are fat and water, but other applications are also possible. The resonance frequencies of fat and water differ by approximately 3.3 ppm (parts per million). One method for separation of the signals of two different tissue types (for example fat and water) is the utilization of the phase information of acquired MR signals.

Furthermore, there is the possibility to differentiate various tissue types based on their different time constants, for example T2 or T2*. For this purpose, it is known to acquire two MR images such that the first MR image corresponds to raw data which were acquired at a first echo time TE1 after the at least one excitation pulse of the imaging sequence and that the second MR image corresponds to raw data which were acquired at a second echo time TE2 (with TE1≠TE2, for example TE1<TE2) after the same excitation pulse or, respectively, the same excitation pulses of the imaging sequence. Each of the MR images includes signals of tissues with a time constant of the decay of the transversal magnetization (T2) for which it applies: T2(tissue)≥TEi (i=1 or 2).

Two MR images are thus acquired, wherein the MR image that corresponds to raw data which were acquired at the echo time TE1 (given TE1<TE2) can include signals of more tissues than the MR image that corresponds to raw data which were acquired at the echo time TE2 (since TE1<TE2≤T2 (tissue)). For example, by pixel-by-pixel subtraction of the two MR images from one another, the tissue that is contained only in the MR image with the shorter echo time can be shown separately or masked out, and thus the tissue types can be selectively displayed.

However, it should to be noted that the two MR images have different intensities (signal strengths) due to the different echo times, depending on the T2 values of the imaged tissue. Therefore, before a subtraction of the MR images from one another, it is necessary to compensate for these intensity differences (for example by weighting factors) in order to be able to actually erase the signals of the unwanted tissue.

SUMMARY OF THE INVENTION

An object of the present invention is to design the generation of an MR image showing selective tissue types from two respective MR images (corresponding to raw data acquired at different echo times after an excitation pulse) so as to be faster and more reliable than conventional techniques.

This object is achieved in accordance with the present invention by a method for automatic generation of a selective MR image from a first MR image (corresponding to raw data acquired at a first echo time after excitation pulses) and a second MR image (corresponding to raw data acquired at a second echo time after the same excitation pulses) that includes the following steps.

For each image point of the MR images, a time constant is calculated that corresponds to a tissue imaged at the respective image point of the MR images depending on the intensity values of the corresponding image points of the first and second MR images.

The calculated time constants are compared with at least one threshold.

Depending on the result of the comparison of the calculated time constant of the image points, a weighting factor is associated with the respective image point.

The selective MR image is generated by processing the intensity values of the image points of the first and/or second MR image with the associated weighting factors.

In this way, relevant time constants are calculated automatically in both MR images, and on the basis of these a selective MR image is created that displays only desired tissue types.

In one embodiment, the raw data corresponding to the first and second MR images are read out with a method that includes the following steps:

a) switch at least two phase coding gradients (Gx, Gy, Gz) in a respective spatial direction by means of a gradient system of the magnetic resonance system, b) after reaching the full strength of the switched phase coding gradients, radiate a non-slice-selective RF excitation pulse by means of an RF transmission/reception device of the magnetic resonance system, c) after a time TE1 after the last radiated excitation pulse, acquire echo signals by means of the RF transmission/reception device and store these as raw data points along the radial k-space trajectory predetermined by the strength of the phase coding gradients, d) repeat steps a) through c) with different phase coding gradients until k-space corresponding to the imaging area is read out in a first region along radial k-space trajectories, depending on the time TE1, and e) read out k-space corresponding to the imaging area, which k-space is not covered by the first region of k-space and which comprises at least the k-space center, in a different manner than that described by steps a) through d), and store these raw data points.

By switching the phase coding gradients and waiting until the switched phase coding gradients have reached their full strength before beginning the RF transmission and the acquisition of echo signals (thus the acquisition of measurement data), the echo time (i.e., the time between the excitation by an RF excitation pulse and the start of the acquisition of the measurement data) can be reduced (for example in comparison to a UTE sequence) in the entirety of k-space to be radially scanned. Echo signals of substances with very short T2 can therefore also be acquired, and the repetition time (the time between two RF excitation pulses) can also be correspondingly reduced. Moreover, the measurement is less prone to interference (for example eddy currents induced in the gradient system during the changing of its current feed) since nothing is measured during the ramping up of the phase coding gradients. Measurement data can therefore be acquired with more precision.

The advantages and embodiments indicated with regard to the method apply analogously to the magnetic resonance system, and the non-transitory, electronically-readable data storage medium.

DESCRIPTION OF THE PREFERRED EMBODIMENTS

Figure 1:
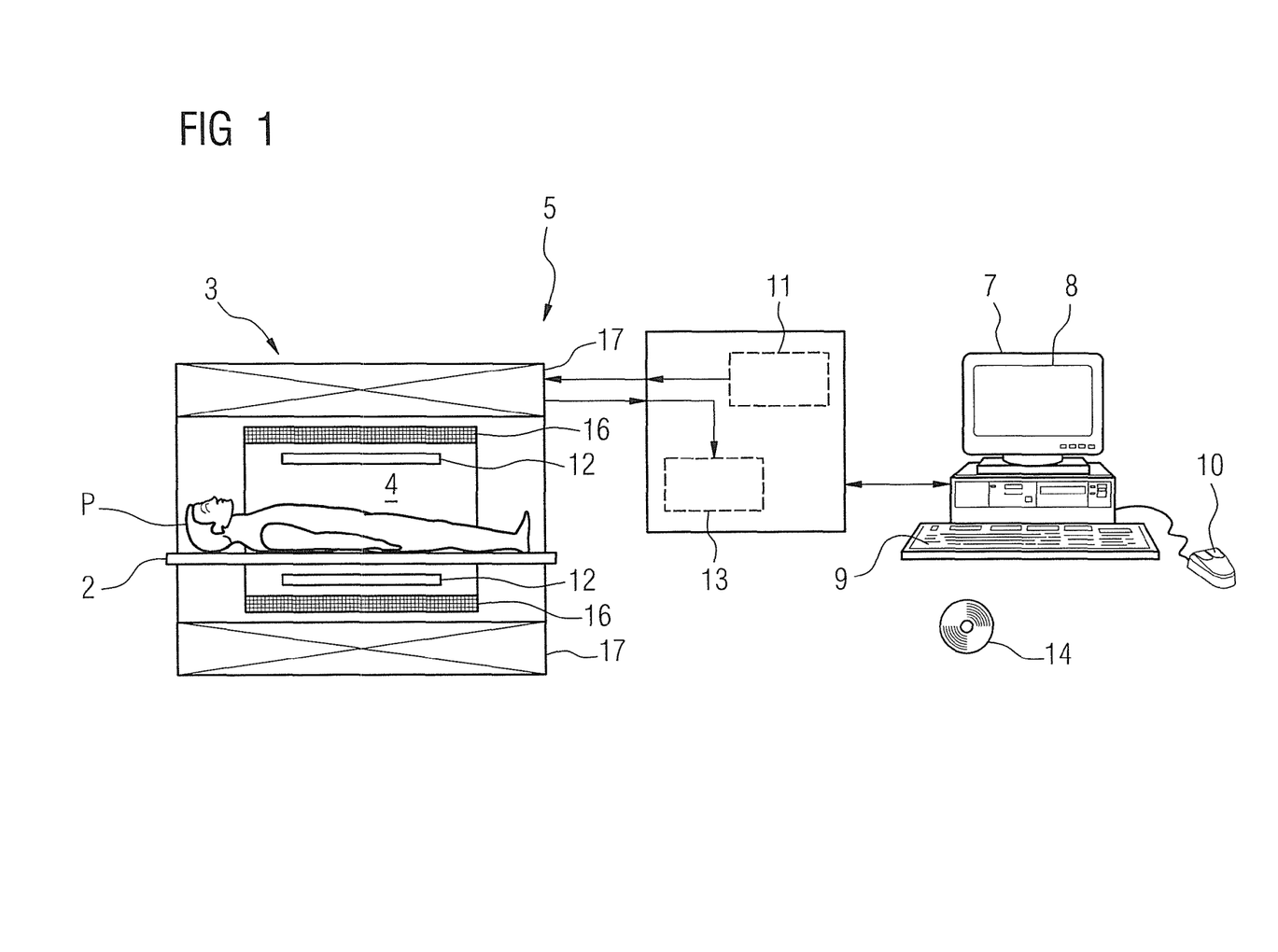
FIG. 1 schematically illustrates a magnetic resonance system according to the invention.

A magnetic resonance system 5 according to the invention is schematically shown in FIG. 1. The magnetic resonance system 5 essentially includes scanner (data acquisition unit) 3 with a basic field magnet 17, and a gradient system 16 with which the magnetic fields necessary for the MR examination, including gradient fields, are generated in a measurement space 4, a transmission/reception device 12 to transmit RF excitation pulses and receive echo signals, a table 2, a control device 6 with which the scanner 3 is operated and raw data are received from the scanner 3, and a terminal 7 connected to the control device 6.

The control device 6 includes an activation unit 11 and an evaluation device 13. During the generation of an image data set, echo signals are acquired by the transmission/reception device 12 by means of the scanner 3, wherein the scanner 3 and the table 2 are activated by the activation unit 11 such that MR data are acquired in an imaging area which is located inside the body of a patient P lying on the table 2.

The evaluation device 13 receives the acquired echo signals as raw data and stores and processes these echo signals. For example, the evaluation device 13 processes the read-out raw data via reconstruction such that they can be graphically presented on a presentation device 8 (on a monitor 8, for example) of the terminal 7. In particular, multiple MR images can be processed with one another, and such that images generated according to the invention are displayed. In addition to the graphical presentation of the image data reconstructed from the raw data, with the terminal 7 (which in addition to the monitor 8 have an input device, for example a keyboard 9 and/or a computer mouse 10) a three-dimensional volume segment to be measured can be predetermined as an imaging area by a user, for example, and additional parameters can be defined for implementation of the method according to the invention.

The software for the control device 6 can also be loaded into the control device 6 via the terminal 7. This software of the control device 6 can also include one of the methods (protocols) according to the invention. It is also possible for one of the methods according to the invention to be embodied in software that runs in the terminal 7. Independently of in which software is used to implement the method according to the invention, software can be stored on a non-transitory, electronically readable data medium (a DVD 14, for example) so that this software can then be read from the DVD 14 by the terminal 7 and be copied either into the control device 6 or into a computer of the terminal 7 itself.

Figure 2:
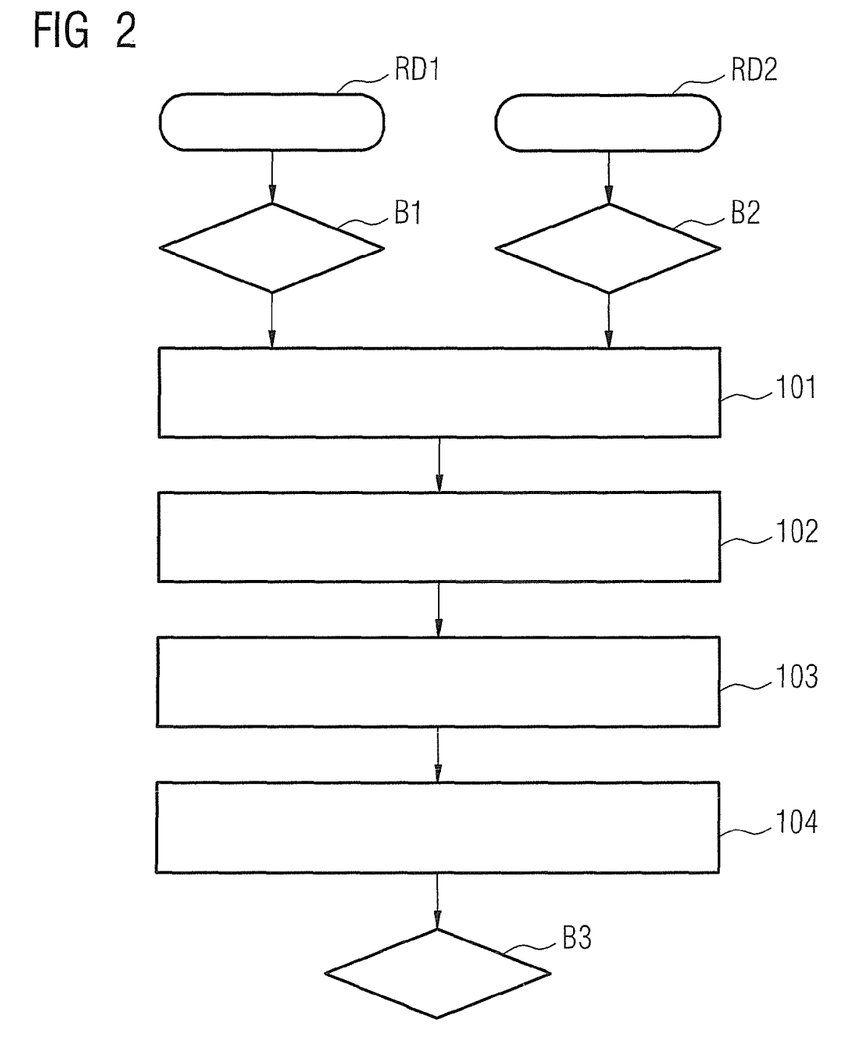
FIG. 2 is a flowchart of an embodiment of a method according to the invention for creation of a selective MR image.

FIG. 2 schematically shows a flowchart of an embodiment of the method to automatically generate a selective MR image. A first MR image B1 (that corresponds to raw data RD1 acquired at a first echo time TE1 after excitation pulses) and a second MR image B2 (that corresponds to raw data RD2 acquired at a second echo time TE2 after the same excitation pulses) are loaded for processing into an evaluation device, for example an evaluation device of a magnetic resonance system, in particular the evaluation device of the magnetic resonance system with which the first MR image and second MR image B1 and B2 were generated.

In a first Step 101, a time constant that corresponds to a tissue depicted at the respective image point of the MR images B1 and B2 is calculated for each image point of said MR images B1 and B2. By the acquisition of the two MR images B1 and B2 in the specified manner (at two different echo times TE1 and TE2 respectively after the same excitation pulse of the acquisition sequence of said MR images B1 and B2), the same imaging area is imaged in corresponding image points of the respective first and second MR image but—as described above—with different intensity due to the different echo times.

The calculation of the time constants for each image point takes place depending on the intensity values of the respective corresponding image point of the first and second MR image B1 and B2.

A simple manner of the calculation of the time constant utilizes the knowledge about the decay of the signal (which decay forms the basis of the acquisition of the raw data) over time, depending on the time constant T, for which:

$$S_{xy}(t)=S_{xy}0*\exp(-t/T) \quad (1);$$

wherein $S_{xy}$ is the signal intensity of the image point (x,y) at the point in time t; $S_{xy}0$ is the signal intensity at the point in time t=0; and the time constant T is, for example, the constant of the decay of the transversal magnetization T=T2 or the constant of the effective decay of the transversal magnetization T=T2\*, depending on the acquisition of the raw data. In such an exemplary embodiment, the time constant corresponding to the imaged tissue is a time constant of the decay of the transversal magnetization of the respective tissue.

The values of $S_{xy}$ at the two points in time t=TE1 and t=TE2 are known from the two MR images B1 and B2.

The time constant T can thus be calculated from the intensity values of the image points of the first MR image $S_{xy}$(TE1) and the intensity values of the image points of the second MR image $S_{xy}$(TE2) via insertion into (1) and reformulation as:

$$S_{xy}(TE1)/S_{xy}(TE2)=\exp((TE2-TE1)/T) \quad (2);$$

$$<=>T=(TE2-TE1)/(\ln(S_{xy}(TE1))-\ln(S_{xy}(TE2))) \quad (3).$$

A time constant that corresponds to a decay of a magnetization of the tissue imaged in the image point is thus obtained from the different intensity values for each image point in the two MR images B1 and B2.

In an additional Step 102, each time constant T calculated for an image point is compared with at least one threshold.

For example, in one exemplary embodiment a threshold indicates an upper limit. Given a comparison of the threshold with the respective time constant, a negative result is hereby returned when the calculated time constant exceeds this upper limit. In another case, a positive result is returned when the calculated time constant does not exceed this upper limit. A separation of the time constants that exceed the threshold and those which do not exceed the threshold can easily be implemented in this manner. The upper threshold is chosen such that those time constants which do not exceed the threshold correspond to a tissue which should be selectively shown.

In a further exemplary embodiment both an upper threshold and a lower threshold can also be specified as an upper limit and lower limit. In the comparison of the threshold with the respective time constant, a negative result is returned when the calculated time constant exceeds the upper threshold or falls below the lower threshold. A positive result is returned when the respective time constant exceeds the lower threshold and falls below the upper threshold. A separation of the time constants that lie between the two thresholds and those that lie outside of the limits of the thresholds can easily be implemented in this manner. The thresholds are selected such that those time constants that lie within the limits of the thresholds correspond to a tissue which should be selectively shown.

In a further Step 103, for each image point a weighting factor is associated with the respective image point depending on the result of the comparison of the calculated time constant of the image points with the threshold or the thresholds. With the use of the weighting factor, by the application of a comparison as described above the image points belonging to the tissue to be selectively shown can be emphasized more strongly in the selective MR image to be created. For this, in a simple exemplary embodiment the weighting factor is set equal to "zero" given a negative result and the weighting factor is set equal to "one" given a positive result. Only the image points belonging to the tissue to be selectively shown are thereby still displayed while all other image points are masked out. However, a less drastic distribution of the weighting factors is also conceivably to be selected which weakens the indicated intensity of the image points with negative result of the comparison relative to those image points with positive result of the comparison. A clear depiction of the tissue to be selectively shown can thus be achieved without entirely masking out its surroundings, which can facilitate an orientation of an observer.

In a last Step 104 a selective MR image is created in that the intensity values of the image points of the first and/or second MR image are processed with the associated weighting factors.

In a simple exemplary embodiment, in the generation of the selective MR image the intensity values of the image points of the first MR image are simply multiplied with the associated weighting factors. As was already stated above, due to the shorter echo time TE1 (<TE2) signals of more or at least as many tissue types as in the second MR image are contained in the first MR image. Therefore, it is sufficient to use the first MR image as a basis for the selective MR image. However, it is also conceivable to average or to add the first and the second MR image, for example, before or after the weighting factors are multiplied with the respective image points, for example in order to improve the signal-to-noise ratio (SNR). However, this is only reasonable in cases when signals of the tissue to be selectively shown are contained both in the first MR image and in the second MR image.

In one exemplary embodiment the raw data corresponding to the first MR image were accordingly acquired at an echo time TE1 after the excitation pulses which is not longer than a time constant of a tissue to be selectively shown; however, the raw data corresponding to the second MR image are acquired at an echo time TE2 which is longer than the time constant of a tissue to be selectively shown. In another exemplary embodiment, both MR images are acquired at echo times TE1 and TE2 which are not longer than a time constant of a tissue to be selectively shown.

Depending on the acquisition technique of the raw data, the time constant of a tissue to be selectively shown is the time constant of the decay of the transversal magnetization of the tissue, for example.

Figure 3:
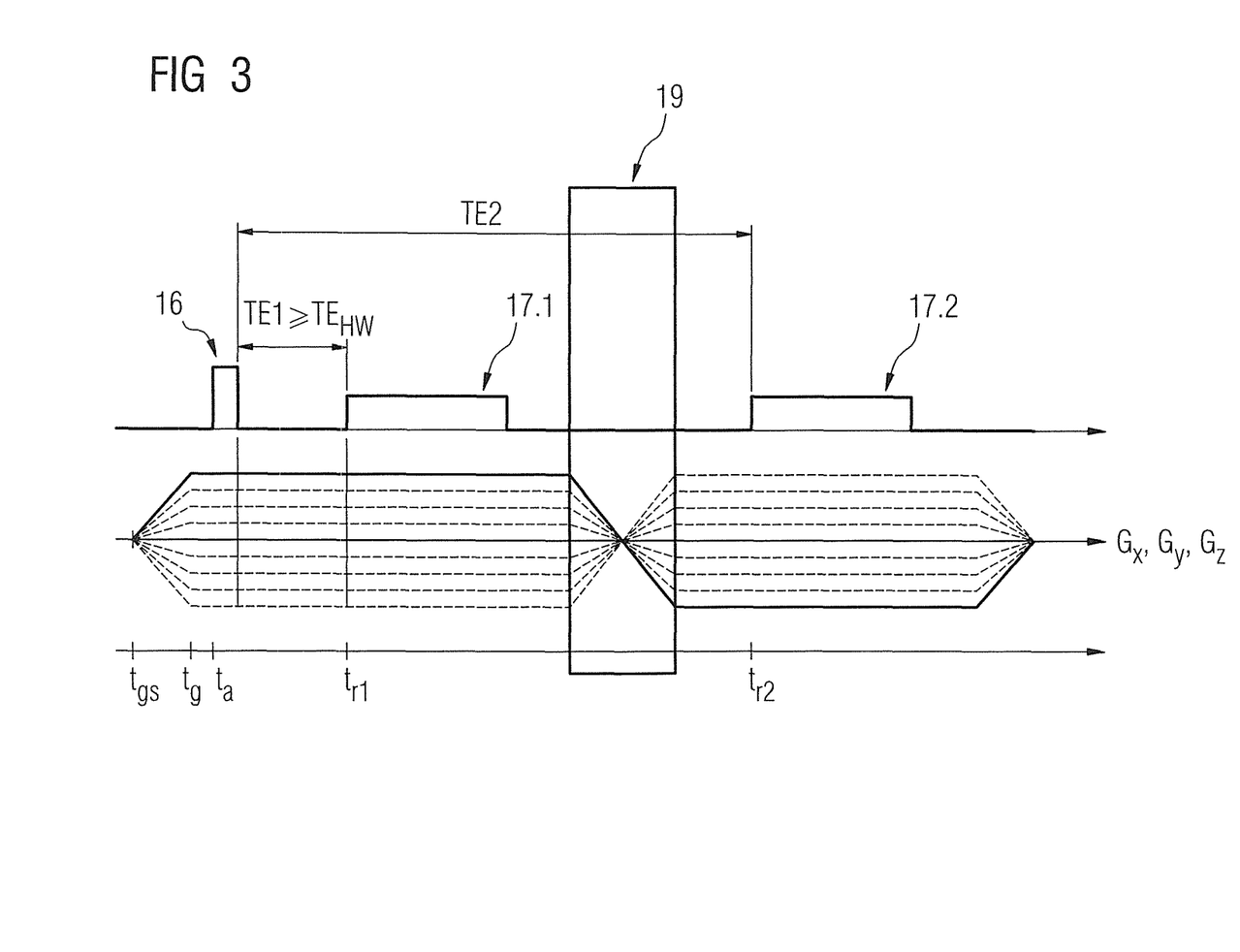
FIG. 3 schematically illustrates a portion of a sequence to acquire multiple raw data points on a radial k-space trajectory with which raw data can be acquired for a first MR image and a second MR image.

The portion of a sequence to be applied in one exemplary embodiment is schematically shown in FIG. 3, which sequence serves to acquire multiple raw data points on a radial k-space trajectory, wherein particularly short echo times (at least of TE1) can be achieved. At least two phase coding gradients $G_x$, $G_y$, $G_z$ are switched by means of a gradient system of a magnetic resonance system at a point in time $t_{gs}$ and reach their full strength at a point in time $t_g$. A non-slice-selective RF excitation pulse 16 is radiated by means of an RF transmission-reception device of the magnetic resonance system at a later point in time $t_a > t_g$. After an echo time TE1 after the RF excitation pulse 16 (that advantageously corresponds to the hardware-dependent minimum switch-over time between a transmission mode and a reception mode of an RF transmission-reception device $TE_{HW}$ that is used), the readout time period 17.1 for readout of the echo signals as raw data along the radial k-space trajectory predetermined by the strength of the phase coding gradient (which radial k-space trajectory forms the basis of the first MR image B1) is begun at a point in time $t_{r1}$. After a refocusing measure 19—for example an inversion of the gradient—and after an echo time TE2 after the RF excitation pulse 16, at the point in time $t_{r2}$ the readout time period 17.2 for reading out the echo signals as raw data along the radial k-space trajectory predetermined by the strength of the phase coding gradient (which radial k-space trajectory forms the basis of the second MR image B2) is begun at a point in time $t_{r2}$.

If the shown portion of the sequence is repeated with different phase coding gradients, a large portion of k-space can be read out quickly in a first region along radial k-space trajectories, which first region is dependent on the time TE1. However, the k-space center cannot be read out in this manner since the echo time TE1 is limited at the low end by the hardware-dependent time $TE_{HW}$ and the strength of the phase coding gradient is not equal to "zero". However, the k-space center can be read out at every point in time between the imaged portions of the sequence, or at the beginning or the end of the sequence, by means of an arbitrary known acquisition technique that allows echo times corresponding to the echo times presented above.

Figure 4:
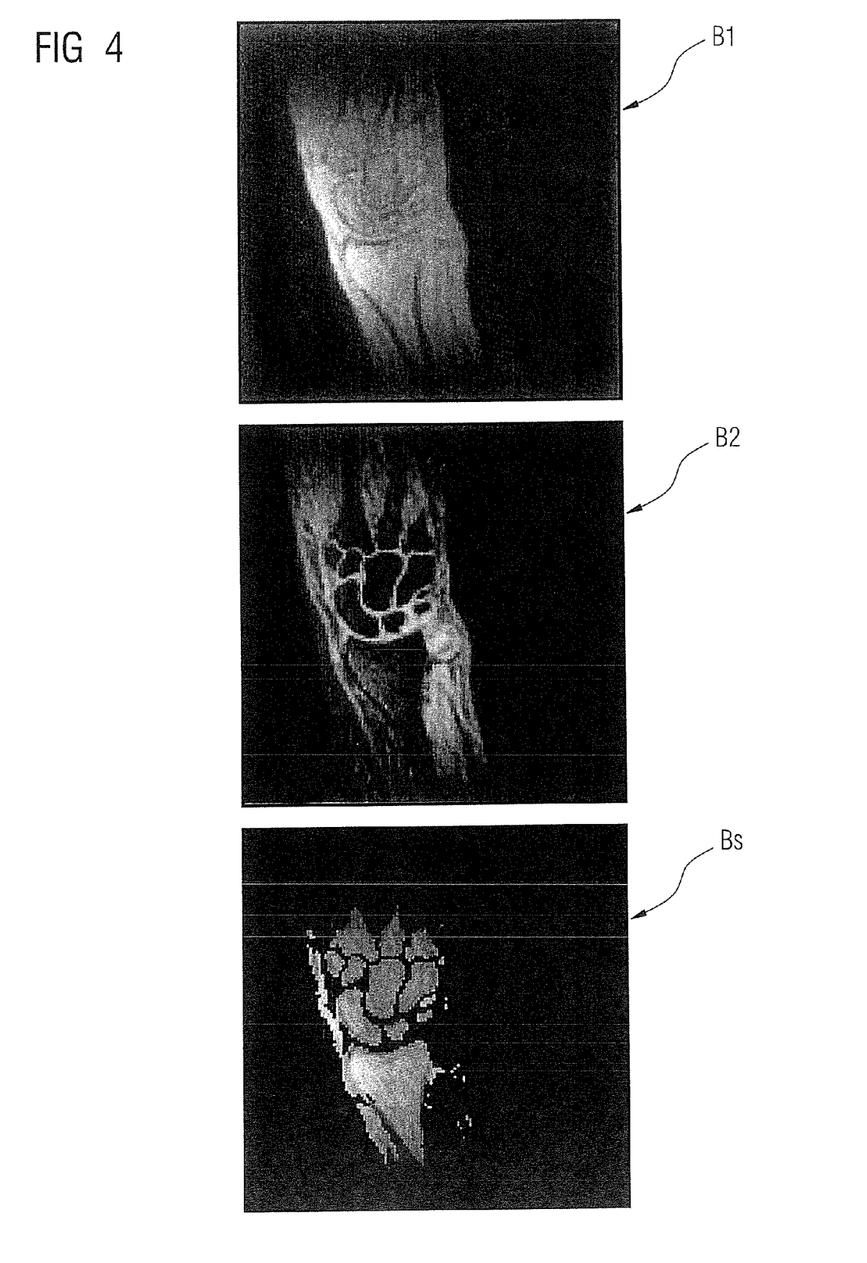
FIG. 4 shows examples of first and second MR images B1 and B2 with an associated selective MR image Bs.

FIG. 4 shows as an example a first MR image B1, an associated MR image B2 and an associated selective MR image Bs created according to the invention.

The shown MR images B1 and B2 are coronal exposures of a wrist of a patient with a resolution of 150/128 mm that were measured with a repetition time TR=10 ms and a total acquisition duration of 50 s. The first MR image B1 hereby corresponds [sic] raw data acquired at a first echo time TE1=50 μs. At the first echo time TE1, signals of bones and ligaments have not yet decayed and these tissues are therefore clearly recognizable in the first MR image B1 in addition to tissues with longer T2 (muscle tissue, for example). The second MR image B2 corresponds to raw data acquired at a second echo time TE2=2280 μs. The signals of bones and ligaments have already decayed at the second echo time TE2 since their time constants of the decay of the transversal magnetization T2 are on the order of approximately 100 μs. Therefore neither bones nor ligaments are recognizable in the second MR image B2.

The selective MR image Bs shown in FIG. 4 was created automatically with the method described above, wherein for the time constants calculated for each image point, an upper boundary exists corresponding to the time constant of the decay of the transverse magnetization of the tissue to be selectively shown (here bone (T2 approximately 30-80 μs) and ligaments (T2 approximately 400-600 μs)), which is why in this case 1500 μs was chosen as an upper limit which selects the tissue to be shown from the softer tissues that are not to be shown (for example muscle with a time constant T2 of approximately 47 ms), since 600 μs<1500 μs<47 ms.

To create the selective MR image Bs whose calculated time constants exceed the upper limit, all image points of the first MR image B1 were multiplied with a weighting factor equal to "zero" in order to not display these image points in the selective MR image Bs. Image points of the first MR image whose calculated time constants lie in a range of the cited threshold were multiplied with a weighting factor equal to "one" and thus are displayed in the selective MR image. As is apparent, only the tissue to be selectively shown (bones and ligaments in this case) is thus displayed in the selective MR image Bs and can thus be examined in more detail by a diagnostic observer.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a selective magnetic resonance (MR) image, comprising:
    acquiring raw data for each of a first MR image and a second MR image by operating a magnetic resonance data acquisition unit by:
    (a) activating at least two phase coding gradients in respective spatial directions with a gradient system of the data acquisition unit,
    (b) after the activated phase coding gradients achieve a full strength, exciting nuclear spins in the examination subject radiating a non-slice-selective RF excitation pulse with an RF transmission/reception system of the data acquisition unit,
    (c) after a time TE1 following the radiated excitation pulse, acquiring first echo signals with said RF transmission/reception system and storing said first echo signals as raw data points in an electronic memory organized as k-space along a radial k-space trajectory in k-space that is predetermined by the strength of the phase coding gradients,
    (d) inverting said at least two phase coding gradients,
    (e) after a time TE2 following the radiated excitation pulse, acquiring said second echo signals with said RF transmission/reception system and storing said second echo signals as raw data points in k-space along a radial k-space trajectory that is determined by the strength of the phase coding gradients,
    (f) repeating (a) through (e) with respectively different phase coding gradients in each repetition until k-space corresponding to the image area is read out in a first region of k-space along radial k-space trajectories, depending on said time TE1 and said time TE2, and (g) reading out a remainder of k-space that corresponds to the imaging area, said remainder not being filled by said first region and including at least a center of k-space, in a read out procedure that is different from (a) through (f), and storing all data points read out in (f) and (g);

in a processor having access to said electronic memory, reconstructing a first MR image from said first echo signals and reconstructing a second MR image from said second echo signals, in said processor, for each image point of said first and second MR images, calculating a time constant that corresponds to tissue imaged at the respective image point, dependent on respective intensity values of corresponding image points in said first and second MR images;

in said processor, comparing each calculated time constant with at least one threshold, to obtain a comparison result;

in said processor, dependent on said comparison result, associating a weighting factor with each image point; and in said processor, generating a selective MR image by processing the respective intensity values of the image points of at least one of said first MR image and said second MR image with the respective, associated weighting factors, and making said selective MR image available in electronic form at an output of said processor.

2. The method as claimed in claim 1, further comprising employing a time constant that represents a decay of transverse magnetization for said tissue.

3. The method as claimed in claim 1, further comprising employing a threshold that represents an upper limit, as said threshold for said comparison, and determining whether the calculated time constant exceeds said upper limit, and indicating a negative comparison result if said time constant exceeds said upper limit and indicating a positive comparison result if said time constant does not exceed said upper limit.

4. The method as claimed in claim 3, further comprising assigning a weighting factor of zero to each image point having a time constant with a negative comparison result and assigning a weighting factor of one to each image point with a time constant having a positive comparison result.

5. The method as claimed in claim 1, further comprising employing a threshold that represents an lower limit, as said threshold for said comparison, and determining whether the calculated time constant falls below said lower limit, and indicating a negative comparison result if said time constant falls below said lower limit and indicating a positive comparison result if said time constant does not fall below said lower limit.

6. The method as claimed in claim 5, further comprising assigning a weighting factor of zero to each image point having a time constant with a negative comparison result and assigning a weighting factor of one to each image point with a time constant having a positive comparison result.

7. The method as claimed in claim 1, further comprising comparing the calculated time constant to an upper threshold that indicates an upper limit and a lower threshold that indicates a lower limit, to determine whether each calculated time constant exceeds said upper threshold or falls below said lower threshold, as a negative comparison result, and to determine whether each time constant exceeds the lower threshold and falls below the upper threshold, as a positive comparison result.

8. The method as claimed in claim 7, further comprising assigning a weighting factor of zero to each image point having a time constant with a negative comparison result and assigning a weighting factor of one to each image point with a time constant having a positive comparison result.

9. The method as claimed in claim 1, further comprising acquiring the raw data for said first MR image with an echo time TE1 following each excitation pulse, with TE1 being less than a time constant of said tissue.

10. The method as claimed in claim 9 wherein said time constant of said tissue is a time constant for decay of transverse magnetization.

11. The method as claimed in claim 1, further comprising generating said selective MR image by multiplying respective intensity values of image points of said first MR image with the associated weighting factors.

12. The method as claimed in claim 1 wherein said RF transmission/reception system has a minimum switchover time between operation in a transmission mode, in which said RF excitation pulse is radiated, and a reception mode, in which said echo signals are read out, and setting said time TE1 equal to said minimum switchover time.

13. The method as claimed in claim 1, further comprising selectively showing tissue selected from the group consisting of bone and ligaments as said tissue.

14. A magnetic resonance (MR) system comprising:

an MR data acquisition unit;

acquiring raw data for each of a first MR image and a second MR image by a control unit configured to operate said MR data acquisition unit by:

(a) activating at least two phase coding gradients in respective spatial directions with a gradient system of the data acquisition unit, (b) after the activated phase coding gradients achieve a full strength, exciting nuclear spins in the examination subject radiating a non-slice-selective RF excitation pulse with an RF transmission/reception system of the data acquisition unit, (c) after a time TE1 following the radiated excitation pulse, acquiring first echo signals with said RF transmission/reception system and storing said first echo signals as raw data points in an electronic memory organized as k-space along a radial k-space trajectory in k-space that is predetermined by the strength of the phase coding gradients, (d) inverting said at least two phase coding gradients, (e) after a time TE2 following the radiated excitation pulse, acquiring said second echo signals with said RF transmission/reception system and storing said second echo signals as raw data points in k-space along a radial k-space trajectory that is determined by the strength of the phase coding gradients, (f) repeating (a) through (e) with respectively different phase coding gradients in each repetition until k-space corresponding to the image area is read out in a first region of k-space along radial k-space trajectories, depending on said time TE1 and said time TE2, and (g) reading out a remainder of k-space that corresponds to the imaging area, said remainder not being filled by said first region and including at least a center of k-space, in a read out procedure that is different from (a) through (f), and storing all data points read out in (f) and (g);

a processor having access to said electronic memory, said processor being configured to reconstruct a first MR image from said first echo signals and reconstruct a second MR image from said second echo signals;

said processor being configured to calculate for each image point of said first and second MR images, a time constant that corresponds to tissue imaged at the respective image point, dependent on respective intensity values of corresponding image points in said first and second MR images;

said processor being configured to compare each calculated time constant with at least one threshold, to obtain a comparison result;

said processor being configured to associate dependent on said comparison result, a weighting factor with each image point;

said processor being configured to generate a selective MR image by processing the respective intensity values of the image points of at least one of said first MR image and said second MR image with the respective, associated weighting factors; and said processor being configured to make said selective MR image available in electronic form at an output of said processor.

15. A non-transitory, computer-readable storage medium encoded with programming instructions, said storage medium being loaded into a computerized control and evaluation system of a magnetic resonance system having a magnetic resonance (MR) data acquisition unit, and said programming instructions causing said computerized control and evaluation system to:

operate the MR data acquisition unit to acquire raw data for each of a first MR image and a second MR image by operating a magnetic resonance data acquisition unit by:

(a) activating at least two phase coding gradients in respective spatial directions with a gradient system of the data acquisition unit, (b) after the activated phase coding gradients achieve a full strength, exciting nuclear spins in the examination subject radiating a non-slice-selective RF excitation pulse with an RF transmission/reception system of the data acquisition unit, (c) after a time TE1 following the radiated excitation pulse, acquiring first echo signals with said RF transmission/reception system and storing said first echo signals as raw data points in an electronic memory organized as k-space along a radial k-space trajectory in k-space that is predetermined by the strength of the phase coding gradients, (d) inverting said at least two phase coding gradients, (e) after a time TE2 following the radiated excitation pulse, acquiring said second echo signals with said RF transmission/reception system and storing said second echo signals as raw data points in k-space along a radial k-space trajectory that is determined by the strength of the phase coding gradients, (f) repeating (a) through (e) with respectively different phase coding gradients in each repetition until k-space corresponding to the image area is read out in a first region of k-space along radial k-space trajectories, depending on said time TE1 and said time TE2, and (g) reading out a remainder of k-space that corresponds to the imaging area, said remainder not being filled by said first region and including at least a center of k-space, in a read out procedure that is different from (a) through (f), and storing all data points read out in (f) and (g);

reconstruct a first MR image from said first echo signals and reconstruct a second MR image from said second echo signals;

for each image point of said first and second MR images, calculate a time constant that corresponds to tissue imaged at the respective image point, dependent on respective intensity values of corresponding image points in said first and second MR images;

compare each calculated time constant with at least one threshold, to obtain a comparison result;

dependent on said comparison result, associate a weighting factor with each image point;

generate a selective MR image by processing the respective intensity values of the image points of at least one of said first MR image and said second MR image with the respective, associated weighting factors; and make said selective MR image available in electronic form at an output of said processor.

\* \* \* \* \*